US012104808B2

(12) United States Patent
Hjortland

(10) Patent No.: US 12,104,808 B2
(45) Date of Patent: Oct. 1, 2024

(54) BUILDING SENSOR WITH SELF-CONFIGURING ANALOG OUTPUT CIRCUIT WITH FAULT DETECTION

(71) Applicant: Johnson Controls Technology Company, Auburn Hills, MI (US)

(72) Inventor: Daniel R. Hjortland, Milwaukee, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 1122 days.

(21) Appl. No.: 16/508,891

(22) Filed: Jul. 11, 2019

(65) Prior Publication Data

US 2021/0010702 A1    Jan. 14, 2021

(51) Int. Cl.
*F24F 11/30* (2018.01)
*F24F 110/70* (2018.01)
(Continued)

(52) U.S. Cl.
CPC ............ *F24F 11/30* (2018.01); *G01N 27/048* (2013.01); *G01R 31/52* (2020.01); *G08B 21/14* (2013.01); *G08B 21/20* (2013.01); *F24F 2110/70* (2018.01)

(58) Field of Classification Search
CPC ....... F24F 11/30; F24F 2110/70; G01R 31/52; G01N 27/048; G08B 21/14; G08B 21/20
See application file for complete search history.

(56) References Cited

U.S. PATENT DOCUMENTS 3,621,716 A * 11/1971 Rosso .................. G01N 27/223
   73/61.61
3,824,461 A * 7/1974 Preikschat ........... G01N 27/041
   324/687

(Continued)

FOREIGN PATENT DOCUMENTS

CN    207882357 U    9/2018

OTHER PUBLICATIONS

Axiomatic Global Electronic Solutions; 2 Universal Inputs, Dual Universal Valve Controller, 6 Pages. Available prior to Jul. 9, 2019.
(Continued)

*Primary Examiner* — Alexander Satanovsky
*Assistant Examiner* — Sharah Zaab
(74) *Attorney, Agent, or Firm* — Foley & Lardner LLP

(57) ABSTRACT

An environmental building sensor, the environmental building sensor including a sensing device configured to measure an environmental condition of a building, an output connection between one or more circuits of the environmental building sensor and an external device, the output connection connected to an input impedance of the external device, and one or more circuits. The one or more circuits are configured to detect a feedback voltage, the feedback voltage based on the input impedance, determine, based on the feedback voltage, whether the external device is configured to receive an analog current input or an analog voltage input from the environmental building sensor, and generate the analog current input or the analog voltage input based on the environmental condition measured by the sensing device and provide the analog current input or the analog voltage input to the external device via the output connection.

13 Claims, 9 Drawing Sheets

(51) Int. Cl.
  *G01N 27/04*   (2006.01)
  *G01R 31/52*   (2020.01)
  *G08B 21/14*   (2006.01)
  *G08B 21/20*   (2006.01)

(56) References Cited

U.S. PATENT DOCUMENTS

| | | | |
|---|---|---|---|
| 4,535,601 A * | 8/1985 | Newell, Jr. | A01K 1/0047 |
| | | | 165/254 |
| 6,219,590 B1 * | 4/2001 | Bernaden, III | F24F 11/64 |
| | | | 700/277 |
| 6,598,003 B1 * | 7/2003 | Heino | G01R 19/2513 |
| | | | 702/68 |
| 6,639,433 B1 | 10/2003 | Heckenbach | |
| 8,680,884 B2 * | 3/2014 | Chobot | H05B 45/50 |
| | | | 324/555 |
| 9,960,665 B2 | 5/2018 | Boncato et al. | |
| 2016/0169827 A1 * | 6/2016 | Hochstetler | G01N 33/553 |
| | | | 204/403.14 |

OTHER PUBLICATIONS

Smart Input/Output Modules, Perfect for a Wide Range of Intelligent Applications and Open Lonworks Environment, 4 Pages, Aug. 2006.

Texas Instruments, XTR300EVM, User's Guide, 19 Pages, Feb. 2006.

* cited by examiner

BUILDING SENSOR WITH SELF-CONFIGURING ANALOG OUTPUT CIRCUIT WITH FAULT DETECTION

BACKGROUND

The present disclosure relates generally to building sensors of a building. More particularly, the present disclosure relates to analog outputs of the building sensors.

In a building, there may be one or multiple building sensors located in various areas of the building. The building sensors can be configured to sense environmental conditions of the building in the various areas in which they are located. The building sensors can be configured to communicate the sensed environmental conditions to a building controller where the building controller can be configured to perform control algorithms and/or facilitate information presentation to an end user based on the sensed environmental conditions. In some cases, the building sensors communicate the sensed environmental conditions to the building controller via a physical wiring connection to the building controller.

A building sensor can be configured to communicate the sensed environmental conditions to the building controller by generating an analog voltage output based on the sensed environmental conditions and providing the analog voltage output to the controller. Furthermore, the building controller can be configured to communicate the sensed environmental conditions to the building controller by generating an analog current output based on the sensed environmental conditions and communicating the analog current output to the controllers. Some building controller inputs can be configured to receive only current inputs or only voltage inputs. These building controller inputs may not be compatible with all types of sensor outputs, i.e., sensors with voltage outputs and sensors with current outputs. Some building controllers, or some building sensors, may include separate, duplicative, current inputs or outputs and separate, duplicative, voltage inputs or outputs to accommodate the different types of inputs.

SUMMARY

One implementation of the present disclosure is an environmental building sensor, the environmental building sensor including a sensing device configured to measure an environmental condition of a building and an output connection between one or more circuits of the environmental building sensor and an external device. The output connection is connected to an input impedance of the external device and the one or more circuits. The one or more circuits are configured to detect a feedback voltage, the feedback voltage based on the input impedance, determine, based on the feedback voltage, whether the external device is configured to receive an analog current input or an analog voltage input from the environmental building sensor, and generate the analog current input or the analog voltage input based on the environmental condition measured by the sensing device and provide the analog current input or the analog voltage input to the external device via the output connection.

In some embodiments, the one or more circuits are configured to determine, based on the feedback voltage, the input impedance and determine that the external device is configured to receive the analog current input or the analog voltage input based on the input impedance.

In some embodiments, the one or more circuits include a first switch and a second switch. In some embodiments, the one or more circuits are configured to open the first switch, disconnecting a signal generator circuit from the external device, close the second switch, connecting a reference voltage to the external device, and determine, based on the feedback voltage and the reference voltage, whether the external device is configured to receive the analog current input or the analog voltage input from the environmental building sensor.

In some embodiments, the one or more circuits include a first switch and a second switch. In some embodiments, the one or more circuits are configured to close the first switch, connecting a signal generator circuit to the external device, open the second switch, connecting a reference voltage to the external device and generate the analog current input or the analog voltage input by the signal generator circuit.

In some embodiments, the output connection is a output terminal including a common wire connection and one or more signal output connections, wherein each of the one or more signal output connections output a particular current signal or a particular voltage signal based on whether a particular external device connected to each of the one or more signal output connections is configured to receive the particular current signal or the particular voltage signal.

In some embodiments, the sensing device is configured to sense at least one of a temperature level of the building, a relative humidity (RH) level of the building, or a carbon dioxide ($CO_2$) level of the building.

In some embodiments, the one or more circuits are configured to detect a second feedback voltage and determine whether at least one of the environmental building sensor or the external device is experiencing a fault based on the second feedback voltage.

In some embodiments, the one or more circuits are configured to generate the analog current input and provide the analog current input to the external device, detect a second feedback voltage, wherein the second feedback voltage is a voltage across a resistor in series with the input impedance, and determine whether a fault exists in at least one of the environmental building sensor or the external device by determining that a voltage output generated by the one or more circuits to generate the analog current input is a maximum value and determining whether the second feedback voltage is zero or non-zero.

In some embodiments, the one or more circuits are configured to determine that the fault is a lack of output headroom in response to a first determination that the output voltage is the maximum value and that the second feedback voltage is non-zero and determine that the fault is an open circuit in response to a second determination that the output voltage is the maximum value and the second feedback voltage is zero.

In some embodiments, the one or more circuits are configured to generate the analog current input and provide the analog current input to the external device, detect a second feedback voltage, wherein the second feedback voltage is a voltage across the input impedance, and determine whether a fault exists in at least one of the environmental building sensor or the external device by comparing a voltage output generated by the one or more circuits to generate the analog current input to the second feedback voltage and determining that the voltage output is a maximum value.

In some embodiments, the one or more circuits are configured to determine that the fault is an open circuit in response to a first determination that the second feedback voltage is equal to the voltage output and that the voltage output is the maximum value and determine that the fault is a lack of output headroom in response to a second determination that the second feedback voltage is less than the voltage output and that the voltage output is the maximum value.

In some embodiments, the one or more circuits are configured to generate the analog voltage input and provide the analog voltage input to the external device, detect a second feedback voltage, and determine whether a fault exists in at least one of the environmental building sensor or the external device based on the second feedback voltage.

In some embodiments, the fault is a short, wherein the one or more circuits are configured to determine whether the fault exists by determining whether the second feedback voltage is greater than or less than a predefined level.

In some embodiments, the second feedback voltage is at least one of a third feedback voltage detected over a resistor of the one or more circuits in series with the input impedance of the external device or a fourth feedback voltage detected over the input impedance of the external device.

Another implementation of the present disclosure is a building system of a building, the building system including a building controller including an input connection, wherein the input connection is associated with an input impedance, wherein the building controller is configured to receive an analog current input or an analog voltage input via the input connection and perform one or more control actions based on the analog current input or the analog voltage input and a building sensor including one or more circuits. The one or more circuits are configured to detect a feedback voltage, the feedback voltage based on the input impedance, determine, based on the feedback voltage, whether the building controller is configured to receive the analog current input or the analog voltage input from the building sensor, and generate the analog current input or the analog voltage input based on a condition measured by a sensing device and provide the analog current input or the analog voltage input to the building controller.

In some embodiments, the one or more circuits are configured to detect a second feedback voltage and determine whether at least one of the building sensor or the building controller is experiencing a fault based on the second feedback voltage.

In some embodiments, the one or more circuits are configured to generate the analog voltage input and provide the analog voltage input to the building controller, detect a second feedback voltage, and determine whether a fault exists in at least one of the building sensor or the building controller based on the second feedback voltage.

Another implementation of the present disclosure is a self-configuring analog output circuit of a sensor. The self-configuring analog output circuit includes one or more circuits configured to detect a feedback voltage, the feedback voltage based on an input impedance of an external device connected to the self-configuring analog output circuit, determine, based on the feedback voltage, whether the external device is configured to receive an analog current input or an analog voltage input from the self-configuring analog output circuit, and generate the analog current input or the analog voltage input based on a condition measured by a sensing device of the sensor and provide the analog current input or the analog voltage input to the external device.

In some embodiments, the one or more circuits are configured to determine, based on the feedback voltage, the input impedance and determine that the external device is configured to receive the analog current input or the analog voltage input based on the input impedance.

In some embodiments, the one or more circuits are configured to detect a second feedback voltage and determine whether the circuit is experiencing a fault based on the second feedback voltage.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Overview

Figure 1:
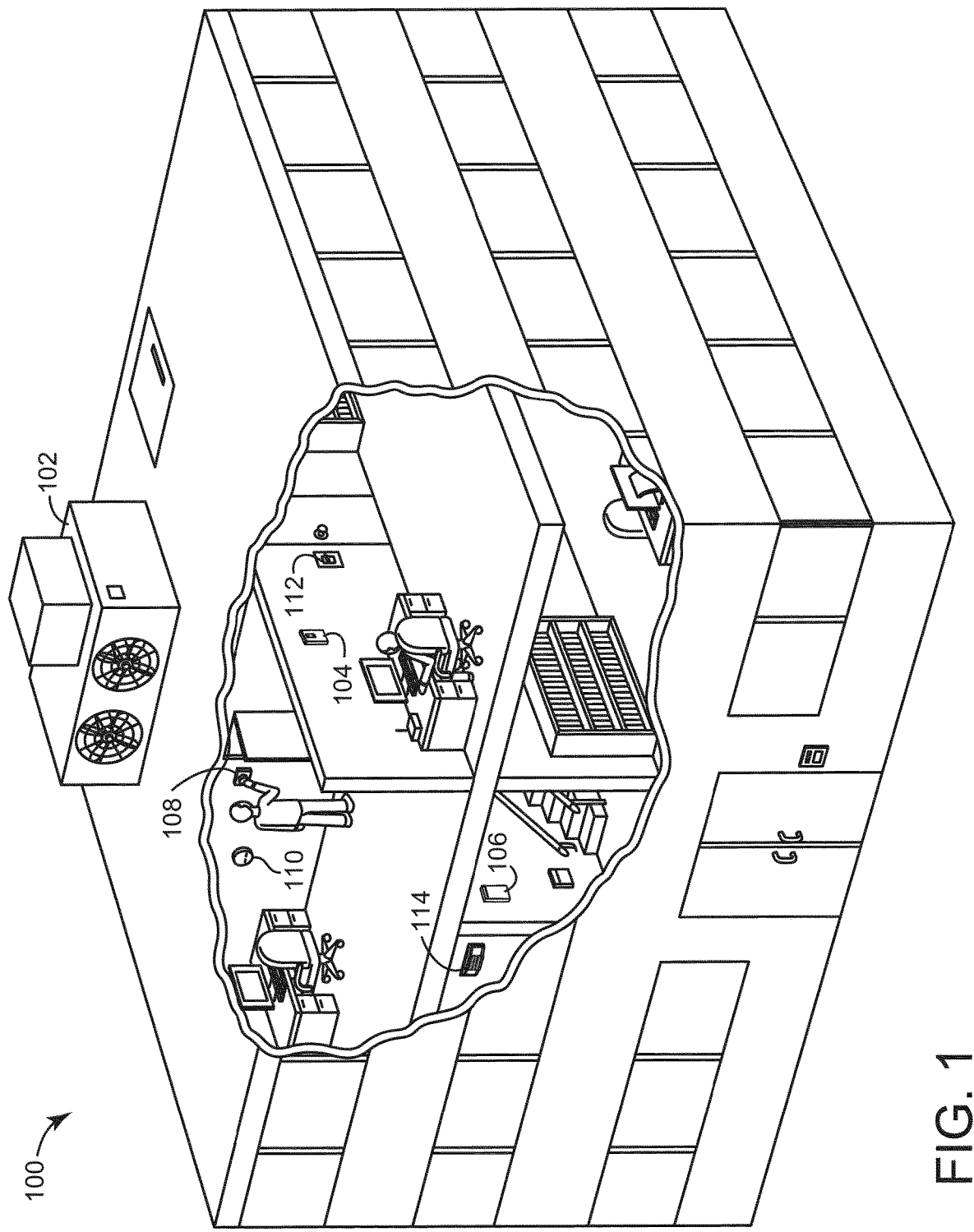
FIG. 1 is a perspective schematic drawing of a building including multiple building sensors and a building controller, according to an exemplary embodiment.

Referring generally to the FIGURES, a building sensor with a self-configuring analog output circuit with fault detection is shown, according to various exemplary embodiments. The building sensor can, in some embodiments, be a powered analog wall mounted sensor. The building sensor can include an analog output configured to communicate sensed environmental conditions to a building controller via a voltage signal or a current signal. The analog output can be configured to receive a feedback signal and can be configured to use the feedback signal to monitor the current being supplied to a load that the output is connected to. The load may be an analog input of the building controller to which the building sensor is communicating. The analog output of the building senor, when outputting a current signal, can use the feedback signal to control the current signal output by the analog output.

Furthermore, based on the feedback signal, the building sensor can be configured to detect whether the analog output of the building sensor (e.g., the transmitter) is in a fault condition, i.e., a voltage output connected to a short circuit, a current output connected to an open circuit, the current output has insufficient voltage headroom for a connected load, etc.

The same circuitry (or different circuitry) used to control the current output and detect faults can be utilized to self-configure the analog output to output the current signal or the voltage signal based on the input of the building controller, i.e., if the building controller is configured to measure a current signal, the building sensor self-configures the analog output to output a current signal. If the building controller is configured to measure a voltage signal, the building sensor self-configures the analog output to output a voltage signal. If the building controller is configured to measure a current signal, the building sensor self-configures the analog output to output a current signal. The analog output of the building sensor can be configured to apply a known reference voltage such that the input resistance of the input of the building controller can be measured. Based on this measurement, the analog output of the building sensor can be configured to determine whether the analog output should output a voltage signal or a current signal.

The analog output circuit is configured to generate voltage or current outputs and self-configure to output the voltage or current based on the sensed configuration of the building controller which the analog output circuit is connected to. This can improve product offerings since one building sensor can be manufactured and deployed that can meet the needs of either voltage input or current input controllers. Furthermore, self-configuring outputs can be configured to reduce installation mistakes where voltage outputs of a building sensor are incorrectly connected to current inputs of the building controller or where current outputs of a building sensor are incorrectly connected to voltage inputs of the building controller. Furthermore, the analog output of the building sensor is configured to sense fault conditions that may occur after installation. The buildings sensor can provide a user with an indication of why the building sensor is not behaving nominally.

In some cases, a product manufacturer may build separate building sensors with different types of outputs. For example, one building sensor may be configured to only output current signals while another building sensor may only be configured to output voltage signals. Either signal may be proportional to a measured environmental parameter measured by the building sensors and can be provided to a controller or control system for monitoring and/or control of a building. However, having multiple different building sensors, one compatible with controllers or control systems configure to receive current signals and another compatible with controllers or control systems configured to receive voltage signals may be disadvantageous since it increases the number for products that need to be designed, manufactured, and/or stocked to meet various customer needs.

As another example, a product manufacturer can building a product with multiple outputs for the same environmental parameter, i.e., duplicative outputs, one outputting a current signal and one outputting a voltage signal for each of one or more environmental parameters. This may be disadvantageous as the additional terminals offer additional ways to incorrectly wire devices increasing the chance of installation mistakes.

The self-configuring analog output for transmitting an environmental parameter as a current signal or a voltage signal from a building sensor to a building controller can solve the problems encountered with separate building sensors configured to either output current signals or voltage signals or a single building sensor with duplicative current signal outputs and voltage signal outputs. The self-configuring analog output reduces the number of products and/or product codes and reduces potential for wiring errors. Furthermore, the feedback signal of the self-configuring analog output used for configuring the output to output either a current signal or a voltage signal can further be used to detect faults in the wiring after installation or assist in troubleshooting field wiring errors.

Although the self-configuring analog output is describe with reference to building sensors, the self-configuring analog output can be implemented into various sensor devices. For example, sensors in industrial control systems, product manufacturing systems, refinement systems, chemical manufacturing systems, vehicles (e.g., aircraft, cars, trucks, nautical ships, spacecraft), etc. can include the self-configuring analog output circuit described herein.

Self-Configuring Analog Output Circuit

Referring now to FIG. 1, a building 100 is shown including building sensors 104-112 configured to communicate information to a building controller 114, according to an exemplary embodiment. The building 100 can be any type of building, e.g., a hospital, a commercial building, an office building, an apartment, a residential home, a school, a factory, a laboratory, etc. The building sensors 104-112 can be configured to collect environmental information in various areas where the building sensors 104-112 are deployed, e.g., temperature, humidity (e.g., relative humidity (RH)), carbon monoxide (CO), carbon dioxide (CO2), occupancy, light intensity, duct pressure, fan speed, power consumption, water temperature, etc.

The building sensors 104-112 can generate values for the environmental conditions and communicate the generated values to the building controller 114 via an analog current signal or an analog voltage signal. The building sensors 104-112 can include physical wiring connections, e.g., signal and common wire connections between the building sensors 104-112 and the building controller 114. These wire connections can communicate the voltage and/or current signal between the building sensors 104-112 and the building controller 114.

The analog current signal and/or the analog voltage signal can be proportional to, or otherwise a function of, the values of the environmental conditions measured by the building sensors 104-112. The building controller 114 can be configured to determine the values of the sensed environmental conditions measured by the building sensors 104-112 and communicated to the building controller 114 based via one or more rules, e.g., via a function, one or more operations, and/or a mapping between the voltage and current values and the sensed environmental values.

The building sensor 108 may be a building thermostat configured to control building equipment. The building thermostat can include a temperature, humidity, and/or occupancy sensor and can be configured to control the building equipment based on the temperature, humidity, and/or occupancy. Furthermore, the building thermostat can communicate, via physical wiring, the generated analog and/or voltage signals representing the measured environmental condition to the building controller 114.

The building sensor 110 can be a smoke detector. The smoke detector can be configured to measure a particular level indicative of smoke within the building 100. The smoke detector can be part of a fire detection system. The smoke level can be communicated by the smoke detector 119 to the building controller 114 via physical wiring as an analog voltage signal and/or an analog current signal. The building sensor 112 can be a smart light switch. The smart light switch can include one or more light sensors configured to measure light levels within a room for operating lighting systems of the room. The smart light switch can be configured to communicate the light levels to the building controller 114 via physical wiring as an analog current signal and/or an analog voltage signal.

The building controller 114 can be a controller configured to receive the environmental conditions sensed by the building sensors 104-114 and generate control decisions for the building 100, e.g., for equipment of the building 100. For example, the building controller 114 can be a heating, ventilation, and air-conditioning (HVAC) controller configured to perform one or more HVAC control algorithms. The building controller 114 can be configured to run one or more air handler unit (AHU) control algorithms and generate control decisions, based on data collected from the building sensors 104-114, that the building controller 114 can be configured to utilize the control decisions to operate the AHU 102 to control the temperature of the building 100. Any type of building equipment, e.g., chiller, boiler, heat-pump, air-conditioner (AC), etc. can be operated by the building controller 114. Furthermore, the building controller 114 can perform lighting control, air quality control, etc. via the measured conditions received from the building sensors 104-112.

Figure 2:
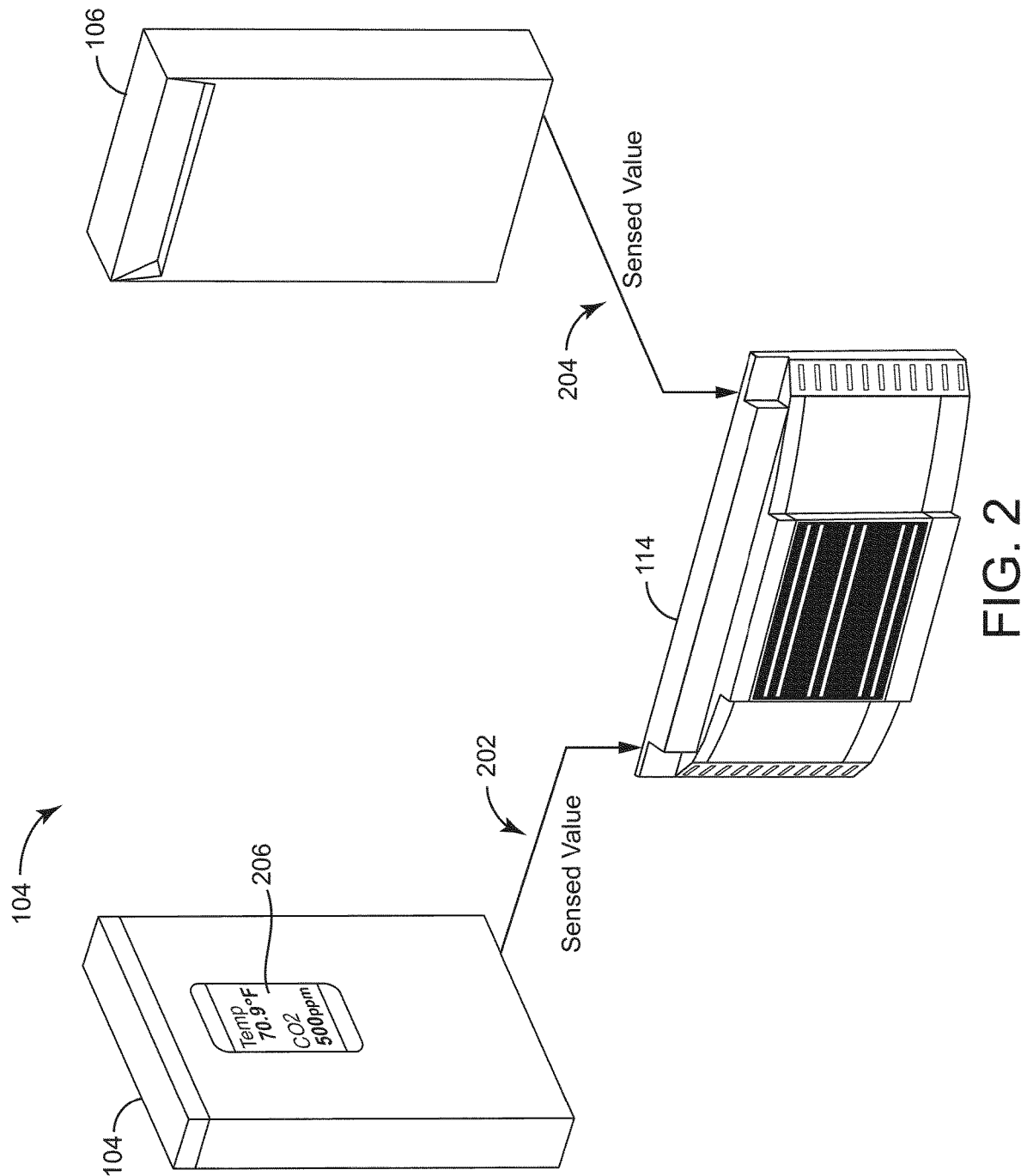
FIG. 2 is a perspective schematic drawing of a system including two of the building sensors communicating sensed values to a building controller, according to an exemplary embodiment.

Referring now to FIG. 2, a system 200 including the building sensor 104 and the building sensor 106 are shown communicating sensed values of environmental conditions to the building controller 114, according to an exemplary embodiment. The building sensors 104 and/or 106 can be configured to measure environmental temperature, RH, and/or $CO_2$, among various other environmental conditions. The building sensors 104 and/or 106 can include displays, e.g., display 206. The display 206 can be configured to display values representative of a temperature and/or $CO_2$. The display 206 can be a liquid crystal display (LCD), a light emitting diode (LED) display, a segment display, etc.

The sensed values collected by the building sensors 104 and 106 can be communicated to the building controller 114 via physical connections. The physical connections can be wire connections 202 and 204. The physical connections, i.e., wire connections 202 and 204, can include one or more wires, e.g., a signal wire and a common wire. Each of the wire connections 202 and 204 can include one or multiple wires capable of transmitting analog voltage signals and analog current signals, the analog signals having a value representing the sensed values. In some embodiments, the building controller 114 is configured to receive only analog current signals or only analog voltage signals. In this regard, the building sensors 104 and/or 106 can self-configure and, based on a feedback voltage signal, select to output a current signal or a voltage signal over the wire connections 202 and/or 204.

Figure 3:
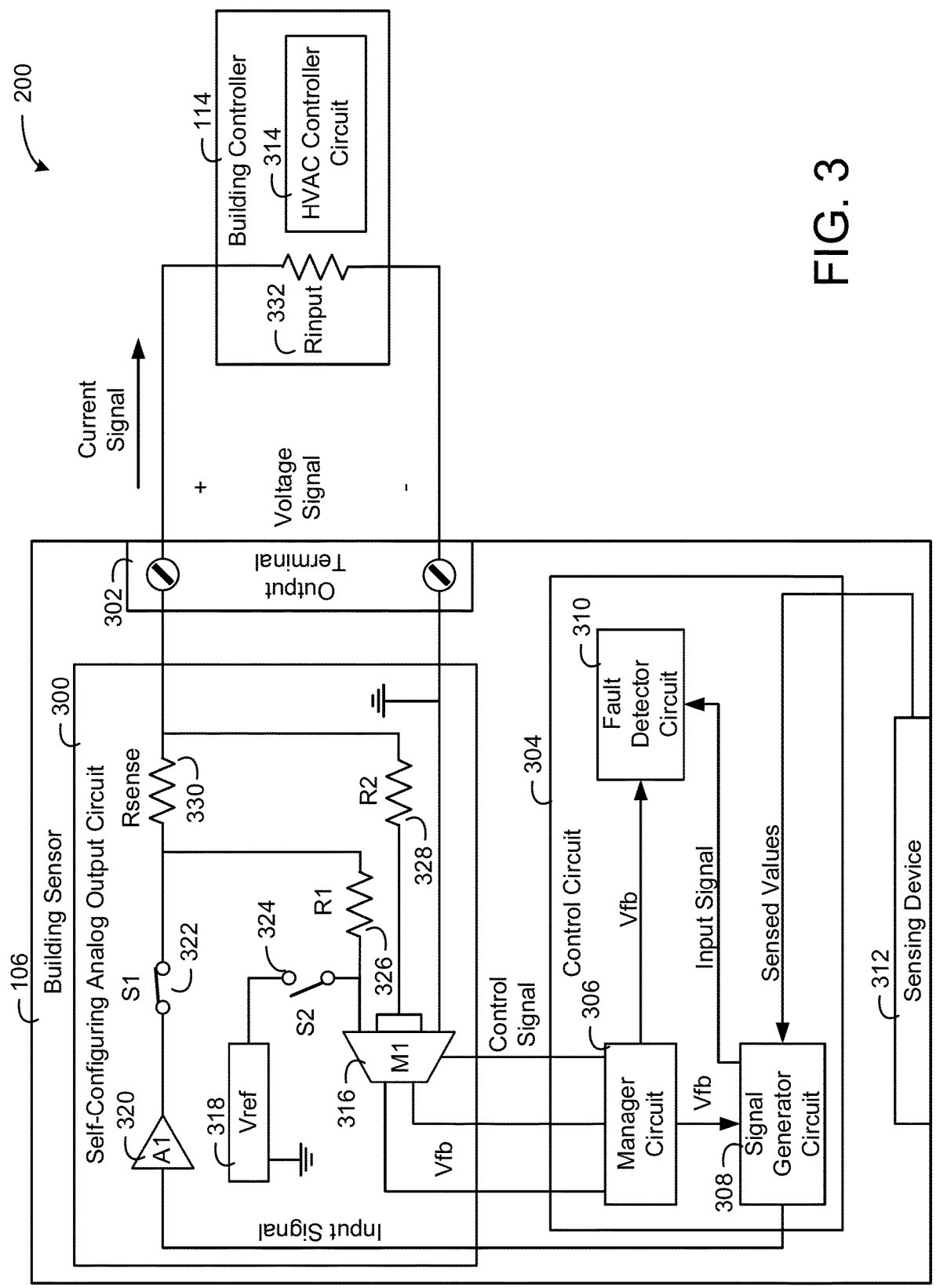
FIG. 3 is a block diagram of one of the sensors of the system of FIG. 2 communicating sensed values to the building controller of FIG. 2 with a self-configuring analog output circuit, according to an exemplary embodiment.
Figure 4:
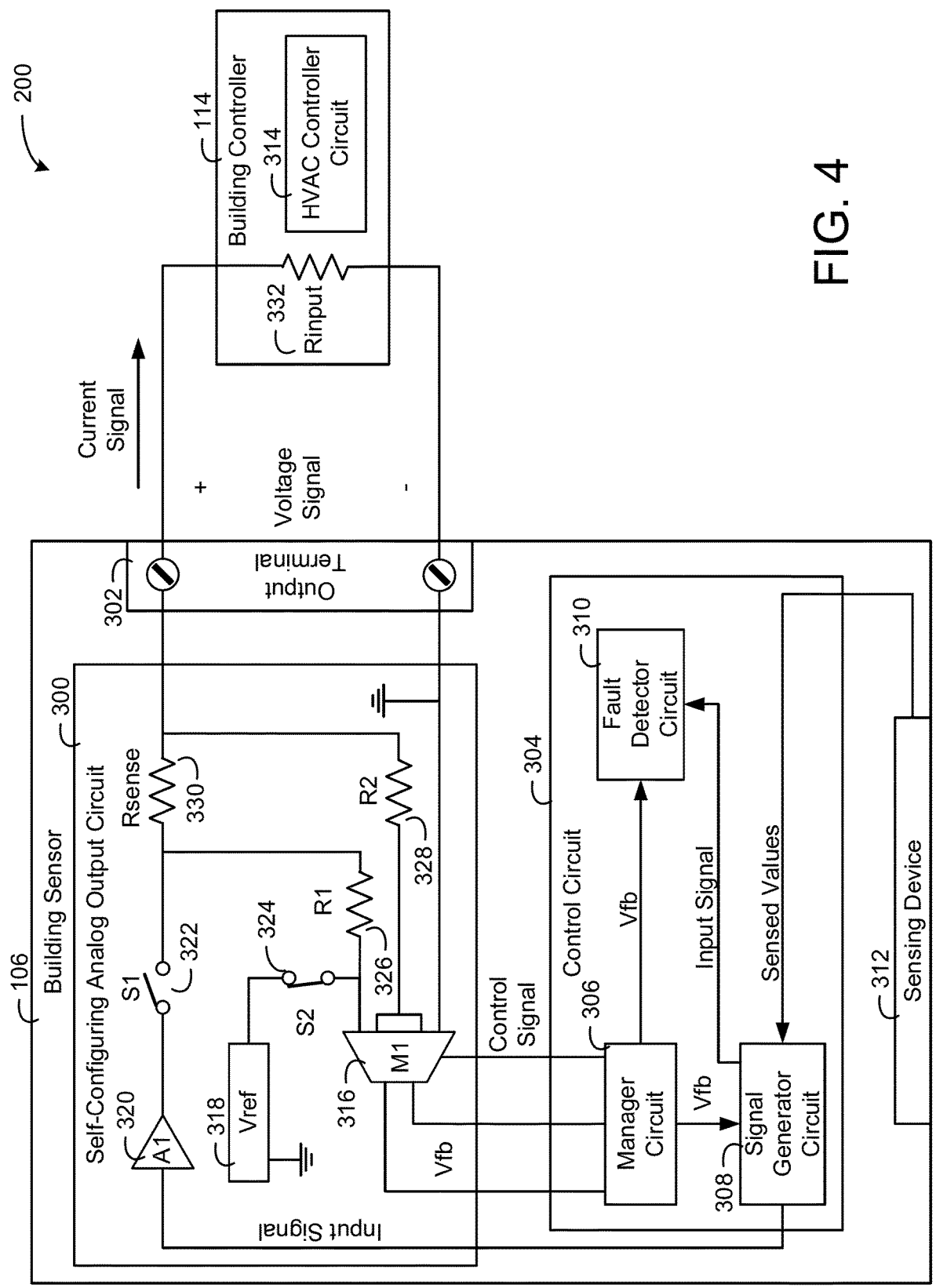
FIG. 4 is another block diagram of the sensor of FIG. 3 and the building controller of FIG. 3 where one or more switches of the sensor are operated to facilitate detection of a reference voltage for configuring the self-configuring analog output circuit of the sensor as a voltage output or a current output, according to an exemplary embodiment.

Referring now to FIGS. 3-4, the building sensor 106 including a self-configuring analog output circuit 300 is shown, the self-configuring analog output circuit 300 communicating an analog output to the building controller 114. The circuit 300 includes switches S1 322 and S2 324. The positions of the switches in FIGS. 3 and 4 respectively configure the circuit 300 to operate in an input impedance determination mode or an output mode. In FIG. 3, the circuit 300 operates in a normal mode where an analog current signal or an analog voltage signal is transmitted to the building sensor 106 to the building controller 114. In FIG. 4, based on the positions of switches S1 322 and S2 324, the circuit 300 measures an input impedance of an analog input of building controller 114 to determine whether to output an analog voltage signal or an analog current signal.

The circuit 300 includes an amplifier circuit A1 320, the switch S1 322, a resistor $R_{sense}$ 330, a reference voltage $V_{ref}$ 318, the switch S2 324, a resistor $R_1$ 326, a resistor $R_2$ 328, and a multiplexer M1 316. In some embodiments, the resistor $R_2$ 328 is an optional component (e.g., replaced with a direct connection) or is combined with a capacitor to form a filter. The amplifier circuit A1 320 can be a circuit configured to generate, or amplify, an input signal for transmission to the building controller 114. The output of the amplifier circuit A1 320 can be an analog current signal and/or an analog voltage signal. The amplifier circuit A1 320 can receive an input signal from a control circuit 304 of the building sensor 106, the input signal may be a current signal or a voltage signal. The amplifier circuit A1 320 can amplify the input signal and cause the input signal to be transmitted to the building controller 114 via an output terminal 302 of the building sensor 106.

The switches S1 322 and S2 324 can be switch circuits operable by the control circuit 304. The switches S1 322 and S2 324 can be transistor circuits, GPIO of a processing circuit, relays, and/or any other switch that the control circuit 304 can operate between an open and/or closed position. The resistors $R_{sense}$ 330, $R_1$ 326, and $R_2$ 328 may be resistors of known values, i.e., the control circuit 304 may store the values of the resistors (or be designed according to the known values of the resistors). The resistors can be metal oxide resistors, cermet film resistors, fusible resistors, etc.

The reference voltage $V_{ref}$ 318 can be a reference voltage source of a known value, i.e., the control circuit 304 can be configured to measure, store a predefined value of, or be designed according to the known value of a voltage value of $V_{ref}$ 318. The reference voltage $V_{ref}$ 318 can be a voltage generated via a power supply of the building sensor 106. The reference voltage $V_{ref}$ 318 can be generated via a voltage divider, an operational amplifier, a buck converter, a transformer, and/or any other circuit configured to generate a voltage of a particular constant value.

The multiplexer circuit M1 316 can be configured to receive a feedback voltage $V_{fb}$. The feedback voltage $V_{fb}$ can be provided to the control circuit 304. The multiplexer circuit M1 316 can be operated via a control signal. The control signal can select between voltages to provide to the control circuit 304 as the feedback voltage $V_{fb}$. For example, the voltage between the resistors $R_1$ 326 and/or $R_2$ 328 can be provided to the control circuit 304 as the reference voltage $V_{fb}$ based on a first value of the control signal (e.g., an on value) while the voltage between the resistor $R_2$ 328 and the output terminal 302 can be provided to the control circuit 304 as the reference voltage $V_{fb}$ based on a second value of the control signal (e.g., an off value). In some embodiments, the circuit 300 does not include the multiplexer M1 316 and instead includes circuit connections for constantly receiving either the voltage between resistors $R_1$ 326 and $R_2$ 328 or between resistor $R_2$ 328 and the output terminal 302.

The output terminal 302 of the building sensor 106 can be a terminal block including one or more insertion points for connecting wires to communicate the output signal generated by the circuit 300 to the building controller 114. Only two connection points of the output terminal 302 are shown in FIG. 2. However, in some embodiments, the building sensor 106 can include multiple terminal connection points for communicating multiple different (or the same) analog outputs. For example, one output may exist to output temperature measurements, another output may exist to output humidity measurements, another output may exist to measure $CO_2$ measurements, etc. In some embodiments, the circuit 300 is implemented multiple times in the building sensor 106 for each of the different outputs, i.e., one or multiple of the outputs of the output terminal 302 are self-configuring outputs with fault detection.

The control circuit 304 can be a microcontroller and/or one or more discrete components (e.g., a logic circuit). The control circuit 304 can be, or can be based on a processing circuit including a processor and a memory. The processor can be a general purpose processor, an application specific integrated circuit (ASIC), one or more field programmable gate arrays (FPGAs), a group of processing components, or other suitable electronic processing components. The processor can be communicatively coupled to the memory. The memory can include one or more devices (e.g., memory units, memory devices, storage devices, etc.) for storing data and/or computer code for completing and/or facilitating the various processes described in the present disclosure. The memory can include random access memory (RAM), read-only memory (ROM), hard drive storage, temporary storage, non-volatile memory, flash memory, optical memory, or any other suitable memory for storing software objects and/or computer instructions. The memory can include database components, object code components, script components, or any other type of information structure for supporting the various activities and information structures described in the present disclosure. The memory can be communicably connected to the processor via the processing circuit and can include computer code for executing (e.g., by the processor) one or more processes described herein.

The control circuit 304 includes a manager circuit 306, a fault detector circuit 310, and/or a signal generator circuit 308. In some embodiments, the manager circuit 306, the fault detector circuit 310, and/or the signal generator circuit 308 are, at least in part, code modules within a memory and are executed by a processor. In some embodiments, the manager circuit 306, the fault detector circuit 310, and/or the signal generator circuit 308 are physical circuits within the building sensor 106 of discrete components (e.g., logic gates, resistors, capacitors, operational amplifiers, etc.). In some embodiments, the building sensor 106 includes discrete components to implement the operations of the manager circuit 306, the fault detector circuit 310, and/or the signal generator circuit 308.

The building sensor 106 includes a sensing device 312. The sensing device 312 can be a component configured to generate a signal representative of an environmental signal. For example, the sensing device 312 can be configured to measure temperature and can be a resistive temperature measuring device (e.g., a thermocouple, a thermistor, a resistance thermometer etc.), a low voltage temperature sensor, a silicon bandgap temperature sensor, and any other electrical and/or mechanical device allowing temperature to be measured. In some embodiments, at least one of current, voltage, resistance, and/or any other measureable quantity proportional to the ambient temperature may be provided as an input to the control circuit 304 from the sensing device 312. In some embodiments, a PWM wave, a sinusoidal wave, and/or any other signal may have characteristics (e.g., duty cycle, frequency, amplitude) proportional to the ambient temperature may be provided as input to control circuit 304 from the sensing device 312. In some embodiments, the sensing device 312 is a nickel-alloy thermocouple, a platinum based thermocouple, a tungsten based thermocouple, and/or any other type of thermocouple.

Furthermore, the sensing device 312 can be a $CO_2$ sensor configured to measure $CO_2$ and provide a value (e.g., resistance value, voltage value, current value) to the control circuit 304 representative of the sensed level of $CO_2$. For example, the $CO_2$ sensor can be an infrared gas sensor (NDIR) and/or a chemical gas sensor. The sensing device 312 can be a humidity sensor. The humidity sensor may be a dry or wet bulb hygrometer, a dew point hygrometer, and/or an electronic hygrometer. In some embodiments, the humidity sensor may measure a RH and/or an absolute humidity. In some embodiments, the RH and/or the absolute humidity is measured based on changes in capacitance and/or changes in resistance determined by various components of the humidity sensor. The humidity sensor may be any other type or combination of humidity sensors. In some embodiments, the signal generator circuit 308 is configured to determine an RH from an absolute humidity measured by the sensing device 312.

The signal generator circuit 308 of the control circuit 304 can be configured to receive values (e.g., digital values, voltage signals, current signals, PWM waves, etc.) from the sensing device 312 and identify a sensed value. For example, signal generator circuit 308 generate, based on an analog input of the sensing device 312, a voltage signal or a current signal that is a function of (e.g., proportional to) the signal generated by the sensing device 312. In some embodiments, based on an operating mode of the circuit 300 (e.g., a current output mode or a voltage output mode), the signal generator circuit 308 a received signal from the sensing device 312 into a current signal (e.g., in the current output mode) or a voltage signal (e.g., in the voltage output mode). In some embodiments, based on a feedback signal, $V_{fb}$, received from the manager circuit 306, the signal generator circuit 308 determines whether to operate in the current output mode or the voltage output mode.

The manager circuit 306 can be configured to manage the circuit 300 by operating the switches S1 322 and S2 324, operating the multiplexer M1 316, and providing feedback information, e.g., $V_{fb}$, to the signal generator circuit 308 and/or the fault detector circuit 310. The manager circuit 306 can be configured to operate the switches S1 322 and S2 324 into open and/or closed positions. In some embodiments, during a normal operation mode, the manager circuit 306 operates the switch S1 322 to be closed and operates the switch S2 324 to be open (e.g., as shown in FIG. 3). Furthermore, in a configuring mode where the building sensor 106 determines whether to output a current signal or a voltage signal to the building controller 114, the manager circuit 306 operates the switch S1 322 into an open position and operates the switch S2 324 into a closed position (e.g., as shown in FIG. 4).

Furthermore, the manager circuit 306 can be configured to provide a control signal to the multiplexer M1 316. The control signal can cause the feedback voltage $V_{fb}$ to be the voltage measured between the resistors $R_1$ 326 and $R_2$ 328 or to be the voltage measured between the resistor $R_2$ 328 and the output terminal 302. The manager circuit 306 can provide feedback voltage $V_{fb}$ to the signal generator circuit 308 and/or the fault detector circuit 310. In some embodiments, the feedback is the reference voltage $V_{fb}$. The signal generator circuit 308 can be configured to use the feedback voltage $V_{fb}$, the reference voltage $V_{ref}$ 318, and/or known component values of the circuit 300 to determine a value for $R_{input}$ 332 of the building controller 114 and determine whether to operate the circuit 300 to output a current signal or a voltage signal.

The fault detector circuit 310 can be configured to detect whether the building sensors 106, the wiring connections to the building controller 114, and/or the building controller 114 have experienced a fault. The fault detector circuit 310 can monitor values of the feedback signal, $V_{fb}$, provided by the manager circuit 306 and/or can compare the feedback to the input signal received from the signal generator circuit 308.

In a normal circuit operation, the switch S1 322 is operated by the manager circuit 306 to a closed position and the switch S2 324 to an open position. During a mode where the building sensor 106 reads the analog input impedance of the building controller 114, the manager circuit 306 operates the switch S1 322 to an open position and the switch S2 324 to a closed position. All of the resistor values $R_{sense}$ 330, $R_1$ 326, and $R_2$ 328 may be stored by the signal generator circuit 308 and/or the signal generator circuit 308 may be designed according to known values of the resistor values. Furthermore, the reference voltage $V_{ref}$ 318 may be stored by the signal generator circuit 308 and/or the signal generator circuit 308 can be designed based on a known value of the reference voltage $V_{ref}$ 318. While values of the components of the circuit 300 may be known, the value of input impedance of an analog input of the building controller 114, i.e., $R_{input}$ 332, may be unknown.

Referring more particularly to FIG. 4 where S1 322 is open and S2 324 is closed, the value of $R_{input}$ 332 can be solved (e.g., by the signal generator circuit 308) in one or more ways. For example, by measuring the voltage across the known resistance, $(R_{sense}+R_1)$, the value of $R_{input}$ 332 can be determined with $V_{fb}$:

$$V_{fb} = V_{R_{sense}} + V_{R_1}$$

$$R_{input} = \frac{V_{ref}}{V_{fb}}(R_1 + R_{sense}) - (R_1 + R_{sense})$$

The manager circuit 306 can be configured to operate the multiplexer M1 316 to cause $V_{fb}$ to be the voltage from $R_1$ 326 to $R_2$ 328. Since the input $V_{fb}$ into the manager circuit 306 may be a high impedance input, the voltage from $R_1$ 326 to $R_2$ 328 is the voltage across $R_1$ 326 and $R_{sense}$ 330, i.e., $V_{fb}=V_{R_{sense}}V_{R_1}$. Since $V_{ref}$ 318, $R_1$ 326, and $R_{sense}$ 330 are known values, the signal generator circuit 308, based on the measured value of $V_{ref}$ 318 received from the manager circuit 306, can determine $R_{input}$ 332.

Furthermore, instead of, or in addition to, looking at the voltage across $R_1$ 326 and $R_{sense}$ 330 to determine $R_{input}$ 332, the voltage across $R_{input}$ 332 can be used. By measuring the voltage across $R_{input}$ 332:

$$V_{fb} = V_{R_{input}}$$

$$R_{input} = \frac{R_1 + R_{sense}}{\frac{V_{ref}}{V_{fb}} - 1}$$

The manager circuit 306 can be configured to operate the multiplexer M1 316 to cause $V_{fb}$ to be the voltage from $R_2$ 328 to the output terminal 302. Since the input $V_{fb}$ into the manager circuit 306 may be a high impedance input, the voltage across $R_2$ 328 to a first terminal of the output terminal 302 may be, negligible i.e., $V_{fb}=V_{R_{input}}$. Since $V_{ref}$ 318, $R_1$ 326, and $R_{sense}$ 330 are known values, the signal generator circuit 308, based on the measured value of $V_{ref}$ 318 received from the manager circuit 306, can determine $R_{input}$ 332.

If the circuit is configured to output a voltage signal, no feedback voltage may be required for proper circuit operation, i.e., to output a voltage across $R_{input}$ 332 of the building controller 114, the voltage generated by the signal generator circuit 308 is not dependent on the value of $R_{input}$ 332. However, the feedback signal, $V_{fb}$, can be used by the fault detector circuit 310 when the signal generator circuit 308 is outputting a voltage signal to determine if a short circuit fault has occurred across the output terminal 302. For example, the manager circuit 306 can operate the multiplexer M1 316, while S1 322 is closed and S2 324 is open, to measure the voltage across $R_{sense}$ 330. Since the input of the manager circuit 306 is a high impedance input and $V_{ref}$ 318 is disconnected form the circuit, the connection of the multiplexer M1 316 between $R_1$ 326 and $R_2$ 328 may measure the voltage across $R_{sense}$ 330. If the voltage across $R_{sense}$ 330 becomes greater than a predefined amount (e.g., becomes equal to the input signal), the fault detector circuit 310 can determine that there is a short across the output terminal 302.

Similarly, while outputting a voltage signal, the manager circuit 306 can operate the multiplexer M1 316 to measure the voltage across $R_{input}$ 332. If the voltage across $R_{input}$ 332 becomes zero or below a predefined amount, the fault detector circuit 310 may generate a fault (e.g., a short circuit fault). Any fault that the fault detector circuit 310 generates can be displayed on a display of the building sensor 106 (e.g., a display similar to the display 206), displayed via one or more LEDs of the building sensor 106, and/or output to the building controller 114.

When operating in current mode, the feedback signal may be required as the current output may be dependent on the unknown value of $R_{input}$ 332. This feedback signal when compared to the input signal will also allow for fault detection of lack of output headroom, where the input signal is at a maximum value and a current flowing through the output terminal 302 is greater than zero. Similarly, the fault detector circuit 310 can detect faults where the current output is connected to an open circuit, where the input signal is at its maximum and the current flowing through the output is equal to zero.

For example, when operating in current mode, any time the fault detector circuit 310 determines that the supply voltage, i.e., the input signal, rises to a maximum level, a fault is present. The input signal may begin to rise until a maximum limit is reached if there is a lack of output headroom or there is an open circuit. The fault detector circuit 310 can determine, in response to detecting the input signal rising to the maximum value, whether the fault is a lack of output headroom or an open circuit. A lack of head room may indicate a lack of head room to meet a desired current output level.

When operating in current mode and the input signal rises to a maximum value, the fault detector circuit 310 can identify whether the fault present is a lack of output headroom or an open circuit based on the feedback voltage $V_{fb}$ when the feedback voltage is a voltage across $R_{sense}$ 330. While the circuit 300 is operating in current output mode, the fault detector circuit 310 can be configured to determine whether the input signal has risen to a maximum value (or can monitor and observe the input signal rising to the maximum value) and determine that a fault is present in response to a determination that the input signal has risen to the maximum value. The fault detector circuit 310 can receive the feedback voltage $V_{fb}$, which can be the voltage across $R_{sense}$ 330. The fault detector circuit 310 can be configured to determine whether the voltage across the resistor $R_{sense}$ 330 is a value approximately zero or non-zero. If the fault detector circuit 310 determines that the voltage is non-zero, the fault detector circuit 310 can be configured to determine that the fault is a lack of output headroom. If the fault detector circuit 310 determines that the voltage across the resistor $R_{sense}$ 330 is zero, the fault detector circuit 310 can determine that the fault is an open circuit, i.e., the output terminal 302 is connected to an open circuit (e.g., is not connected properly or is not connected at all). With a lack of output-headroom, the voltage across the resistor $R_{sense}$ 330 is non-zero as at least some amount of current will stay flowing through the circuit 300, i.e., through the resistor $R_{sense}$ 330. With an open circuit fault, no current will be flowing through the circuit 300 i.e., no current flowing through the resistor $R_{sense}$ 330.

When operating in current mode and the input signal rises to a maximum value, the fault detector circuit 310 can identify whether the fault present is a lack of output headroom or an open circuit based on the feedback voltage $V_{fb}$ when the feedback voltage is a voltage across $R_{input}$ 332. The fault detector circuit 310 can determine, based on the received feedback voltage $V_{fb}$ across the resistor $R_{input}$ 332, whether a fault detected by the fault detector circuit 310 in response to determining that the input signal has risen to a maximum value, is a lack of output headroom or an open circuit. If the voltage across the resistor $R_{input}$ 332 is approximately equal to the input signal, the fault detector circuit 310 can be configured to determine that there is an open circuit, i.e., the output terminal 302 is not properly, or is not connected at all, to the building controller 114. If the voltage across the resistor $R_{input}$ 332 is less than the input signal, the fault detector circuit 310 can be configured to determine that there is a lack of output headroom.

The building controller 114 includes an HVAC controller circuit 314. The HVAC controller circuit 314 can be a processing circuit configured to implement one or more control operations based on sensor readings of the sensing device 312. The HVAC controller circuit 314 can operate various pieces of building equipment, e.g., the AHU 102. The control algorithms performed by the HVAC controller circuit 314 can be state-based algorithms, extremum-seeking control algorithms, proportional algorithms, proportional integral algorithms, PID control algorithms, model predictive control algorithms, feedback control algorithms, etc.

Figure 5:
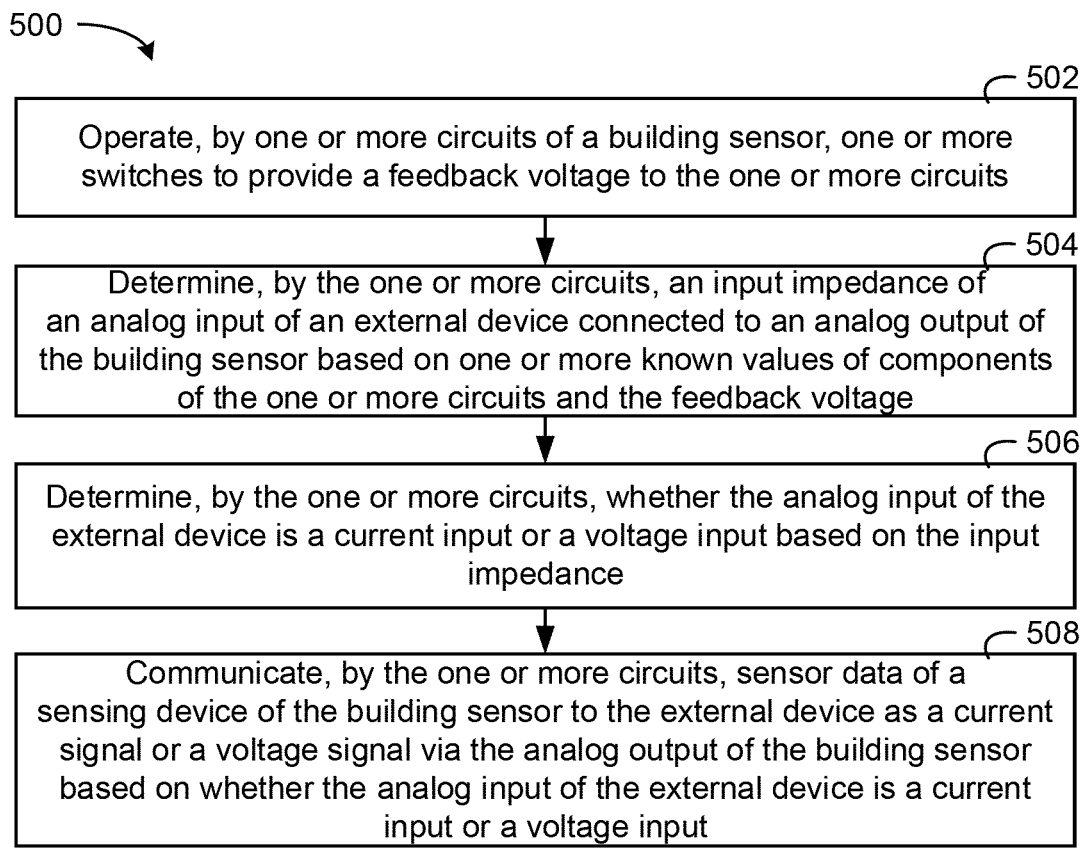
FIG. 5 is a flow diagram of a process of self-configuring the analog output of the building sensor of FIGS. 3-4 as a current output or a voltage output based on a feedback voltage, according to an exemplary embodiment.

Referring now to FIG. 5, a process 500 is shown for self-configuring an analog output to output a voltage signal or a current signal, according to an exemplary embodiment. The process 500 is described with reference to the building sensor 106 and thus the building sensor 106 can be configured to perform the process 500. More particularly, the circuits 300 and 304 can be configured to perform the process 500. In some embodiment, the process 500 can be performed by any of the sensors 104-112 and/or the building controller 114, i.e., the sensors 104-112 and/or the building controller 114 can include circuits the same as, or similar to, the circuits 300 and 304. While performing the process 500, the switch S1 322 may be open while the switch S2 324 may be closed.

In step 502, the building sensor 106 can operate, by one or more circuits of the building sensor 106, one or more switches to provide a feedback voltage to the one or more circuits. More particularly, the manager circuit 306 can operate the switches S1 322 and S2 324 to be open and closed respectively. Opening switch S1 322 and closing switch S2 324 may provide a feedback voltage to the manager circuit 306. In some embodiments, the feedback voltage, $V_{fb}$, is the voltage across resistors $R_1$ 326 and $R_{sense}$ 330. In some embodiments, the feedback voltage, $V_{fb}$, is the voltage across the resistor $R_{input}$ 332. Furthermore, opening switch S1 322 and closing switch S2 324 connects the reference voltage, $V_{ref}$, to the circuit 300.

In step 504, the one or more circuits can determine an input impedance of an analog input of an external device connected to an analog output of the building sensor 106 based on one or more known values of the components of the one or more circuits and the feedback voltage of the step 502. In some embodiments, the signal generator circuit 308 determines the impedance, $R_{input}$ 332, of the building controller 114 where $R_{input}$ 332 is the input impedance of an analog input of the building controller 114 connected to the output terminal 302.

In some embodiments, the known values of a reference voltage, the reference voltage $V_{ref}$, and resistor values of resistors $R_{sense}$ 330 and $R_1$ 326 can be used to determine the input impedance, $R_{input}$ 332. If the feedback voltage is the voltage across the resistors $R_1$ 326 and $R_{sense}$ 330, the value of $R_{input}$ 332 can be determined as:

$$R_{input} = \frac{V_{ref}}{V_{fb}}(R_1 + R_{sense}) - (R_1 + R_{sense})$$

If the feedback voltage is a voltage across the resistor $R_{input}$ 332, the value of $R_{input}$ 332 can be determined as:

$$R_{input} = \frac{R_1 + R_{sense}}{\frac{V_{ref}}{V_{fb}} - 1}$$

Based on the input impedance determined in the step 504, the one or more circuits of the building sensor 106 can determine whether the analog input of the external device is a current input or a voltage input. The signal generator circuit 308 can determine that the analog input of the building controller 114 is a current input or a voltage input by comparing the determined input impedance of the step 504 to one or more thresholds. For example, if the input impedance is less than a predefined amount (e.g., 500Ω), the signal generator circuit 308 can determine that the input is a current input. If the input impedance is greater than a predefined amount (e.g., 500Ω), the signal generator circuit 308 can determine that the input of the building controller 114 is a voltage input.

Based on the determination of the step 506, in step 508, the one or more circuits can communicate sensor data of a sensing device of the building device 116 as either a voltage signal or a current signal to the external device. For example, if the input of the building controller 114 is a voltage input, the signal generator circuit 308 can generate a voltage signal based on values of the sensing device 312 and cause the circuit 300 to communicate the voltage signal to the building controller 114. Similarly, if the input of the building controller 114 is an current input, the signal generator circuit 308 can generate a current signal based on values of the sensing device 312 and cause the circuit 300 to communicate the current signal to the building controller 114.

Figure 6:
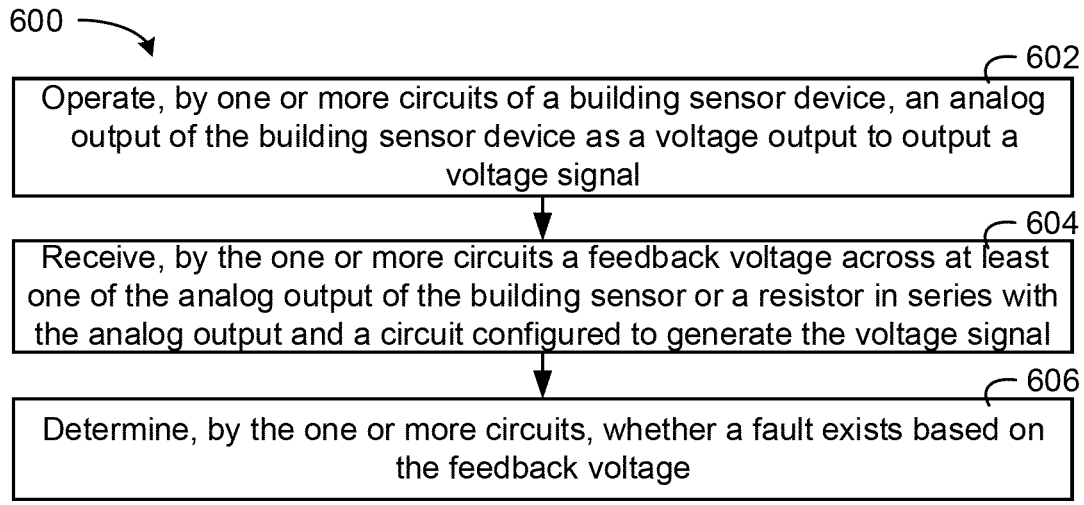
FIG. 6 is a flow diagram of a process of fault detection while operating the self-configuring analog output circuit of the building sensor of FIGS. 3-4 as a voltage output, according to an exemplary embodiment.

Referring now to FIG. 6, a process 600 is shown for detecting a fault by the building sensor 106 when the building sensor 106 is outputting a voltage signal, according to an exemplary embodiment. The process 600 is described with reference to the building sensor 106 and the building sensor 106 can be configured to perform the process 600. More particularly, the circuits 300 and 304 can be configured to perform the process 600. In some embodiment, the process 600 can be performed by any of the sensors 104-112 and/or the building controller 114, i.e., the sensors 104-112 and/or the building controller 114 can include circuits the same as, or similar to, the circuits 300 and 304. While performing the process 600, the switch S1 322 may be closed while the switch S2 324 may be open.

In step 602, one or more circuits of the building sensor 106 can operate an analog output of the building sensor 106 as a voltage output. The step 602 may be the same as or similar to the step 508 as described with reference to FIG. 5. Furthermore, in some embodiments, before performing the step 602, the one or more circuits determine whether an input of an external device is connected to the building sensor 106 is a voltage input, i.e., perform the steps 502-506 as described with reference to FIG. 5.

In step 604, the one or more circuits can receive a feedback voltage across at least one of an output of the building sensor or a resistor in series with an output and a circuit configured to generate the analog output. For example, the manager circuit 306 can operate the multiplexer M1 316 to measure a voltage across $R_2$ 328 and the output terminal 302, which is the voltage across the output terminal 302 since there is an negligible voltage drop over the resistor $R_2$ 328. Furthermore, the manager circuit 306 can operate the multiplexer M1 316 to measure the voltage between resistor $R_1$ 326 and $R_2$ 328 which may be the voltage across the resistor $R_{sense}$ 330 since the voltage drop across the resistors $R_1$ 326 and $R_2$ 328 is negligible.

In step 606, the one or more circuits determine whether there is a fault based on the feedback voltage. For example, the one or more circuits can determine whether the output of the building sensor 106 is shorted. For example, the fault detector circuit 310 can determine whether the output terminal 302, the circuit 300, and/or the building controller 114 has a short. For example, if the feedback voltage is the voltage across the output terminal 302, if the voltage becomes less than a predefined amount (e.g., close to zero), the fault detector circuit 310 can determine that there is a fault (e.g., a short). Furthermore, if the feedback voltage is the voltage across the resistor $R_{sense}$ 330, the fault detector circuit 310 can determine that there is a fault by determining that the voltage is greater than a predefined amount. If the voltage across the resistor $R_{sense}$ 330 is zero, this may indicate an open circuit. Furthermore, if the voltage across the resistor $R_{sense}$ 330 is the same as (e.g., within a predefined range of) the voltage signal being provided to the building controller 114, this may indicate that there is a fault (e.g., a short).

Figure 7:
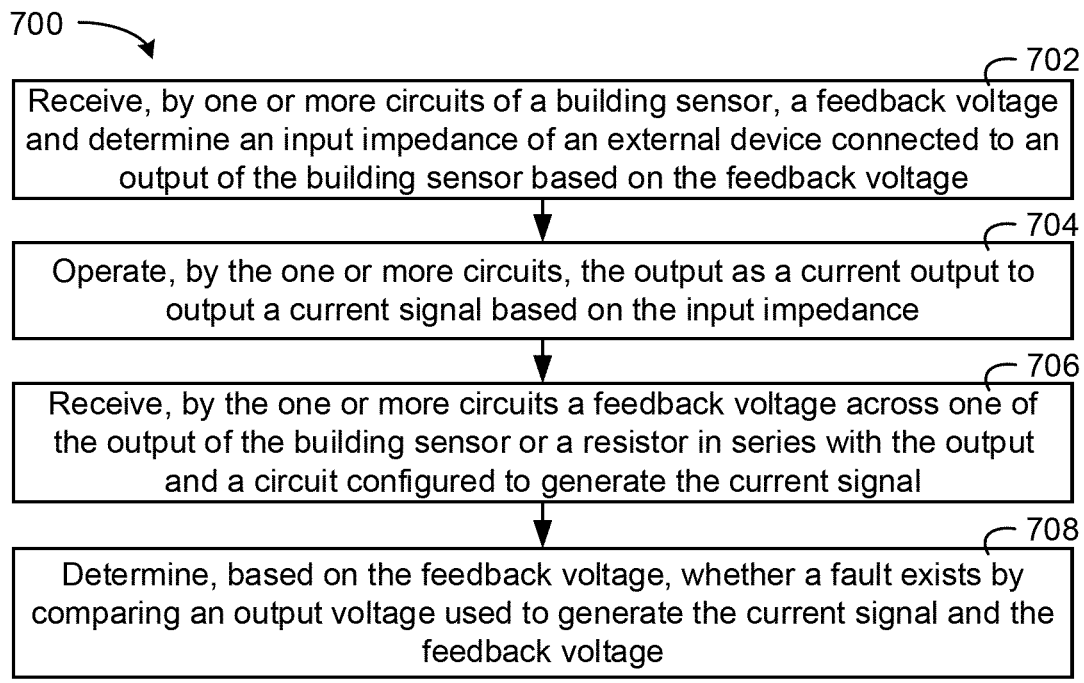
FIG. 7 is a flow diagram of a process of fault detection while operating the self-configuring analog output circuit of the building sensor of FIGS. 3-4 as a current output, according to an exemplary embodiment.

Referring now to FIG. 7, a process 700 is shown for detecting a fault by the building sensor 106 when the building sensor 106 is outputting a current signal, according to an exemplary embodiment. The process 700 is described with reference to the building sensor 106 and the building sensor 106 can be configured to perform the process 700. More particularly, the circuits 300 and 304 can be configured to perform the process 700. In some embodiment, the process 700 can be performed by any of the sensors 104-112 and/or the building controller 114, i.e., the sensors 104-112 and/or the building controller 114 can include circuits the same as, or similar to, the circuits 300 and 304. While performing the process 700, the switch S1 322 may be open while the switch S2 324 may be closed in step 702. In steps 704-708, the switch S1 322 may be closed while the switch S2 324 may be open.

In step 702, one or more circuits of the building sensor 106 can receive a feedback voltage and determine an input impedance of an external device connected to an output of the building sensor 106 based on the feedback voltage. For example, the feedback voltage may be the voltage $V_{fb}$ across the resistors $R_1$ 326 and $R_{sense}$ 330 or the voltage across the resistor $R_{input}$ 332. With either voltage, the one or more circuits determine the value of the input impedance of the external device, e.g., $R_{input}$ 332 of the building controller 114 as described with reference to FIGS. 4-5.

In step 704, based on the input impedance determined in the step 702, the one or more circuits of the building sensor 106 can operate the output as a current output. For example, the signal generator circuit 308 can output a current value with a value based on a sensor reading of the sensing device 312. The signal generator circuit 308 can generate a voltage signal which, when applied over the input of the building controller 114, e.g., the resistor $R_{input}$ 332, causes a current to flow through the building controller 114, e.g., through the resistor $R_{input}$ 332, with a value based on the sensed reading of the sensing device 312.

In step 706, the one or more circuits can receive a feedback voltage across one of an output of the building sensor 106 or across a resistor in series with the output and a circuit configured to generate the analog output. For example, the feedback voltage can be the voltage across the output terminal 302 or the voltage across the resistor $R_{sense}$ 330. The feedback voltage can be received by the manager circuit 306 and provided to the fault detector circuit 310.

In step 708, the one or more circuits of the building sensor 106 can determine whether there is a fault by comparing the output. For example, the fault detector circuit 310 can utilize both the input voltage generated by the signal generator circuit 308 and the feedback voltage $V_{fb}$ measured by the manager circuit 306. In some embodiments, if the input voltage is at a maximum value and a current flowing through the output terminal 302 of the building sensor 106 (as can be determined from $V_{fb}$ across the resistor $R_{sense}$ 330 and the value for $R_{sense}$ 330 or from $V_{fb}$ across the resistor $R_{input}$ 332 and the value of $R_{input}$ 332) is greater than zero or equal to zero. This may indicate that there is not enough output headroom or an open circuit. If the input voltage is at a maximum value and the current flowing through the output is equal to zero, this may indicate that there is an open circuit. If the input voltage is at a maximum value and the current flowing through the output is non-zero, this may indicate that there is a lack of output headroom.

Figure 8:
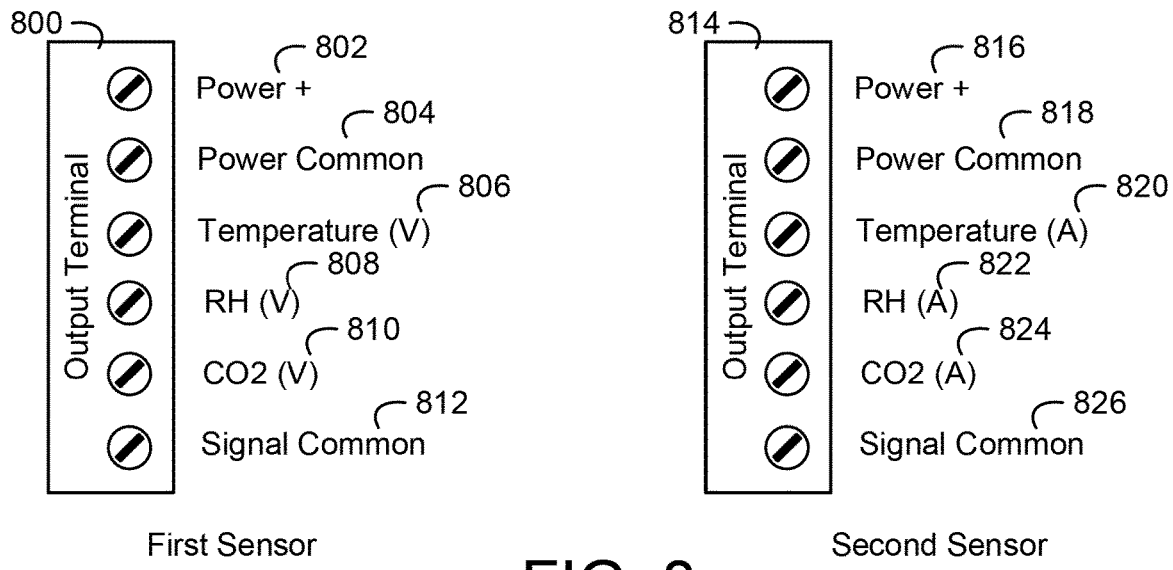
FIG. 8 is a block diagram of a first output terminal of a first building sensor configured to generate analog voltage outputs and a second output terminal of a second building sensor configured to generate analog current outputs, according to an exemplary embodiment.

Referring now to FIG. 8, two different sensor terminal blocks of building sensors, output terminal 800 and output terminal 814 are shown, according to an exemplary embodiment. The output terminal 800 may be a terminal block for a sensor with a hot power connection 802, a common power connection 804, a temperature voltage output 806, a RH voltage output 808, a CO2 voltage output 810, and a signal common connection 812. The connections 802 and 804 may be connections for powering the building sensor from another device, e.g., the building controller 114. The outputs 806-810 may be outputs of environmental conditions (i.e., temperature, RH, and CO2) measured by the building sensor and output as a voltage signal. The signal common connection 812 may be a common connection for the outputs 806-810.

The output terminal 814 may be a terminal block for a sensor with a hot power connection 816, a common power connection 818, a temperature current output 820, a RH current output 822, a CO2 current output 824, and a signal common connection 826. The outputs 820-824 may be connections for powering the building sensor from another device, e.g., the building controller 114. The outputs 820-824 may be outputs of environmental conditions (i.e., temperature, RH, and CO2) measured by the building sensor and output as a voltage signal. The signal common connection 826 may be a common connection for the outputs 820-824.

While the building sensors utilizing the output terminals 800 and 814 may be similar, they may be deployed for different purposes. A building sensor with the output terminal 800 may be deployed where the building controller 114 is configured to receive voltage signals while a different building sensor with the output terminal 814 can be deployed where the building controller 114 is configured to receive current signals. In this regard, two different similar building sensors may need to be manufactured and deployed according to constraints placed on the building sensors by the building controller 114. However, the building sensor 106 may be applicable for either situation, when the building controller 114 is configured to sense voltage inputs or current inputs since the building sensor 106 can self-configure and output either a voltage signal or a current signal.

Figures 9, 10:
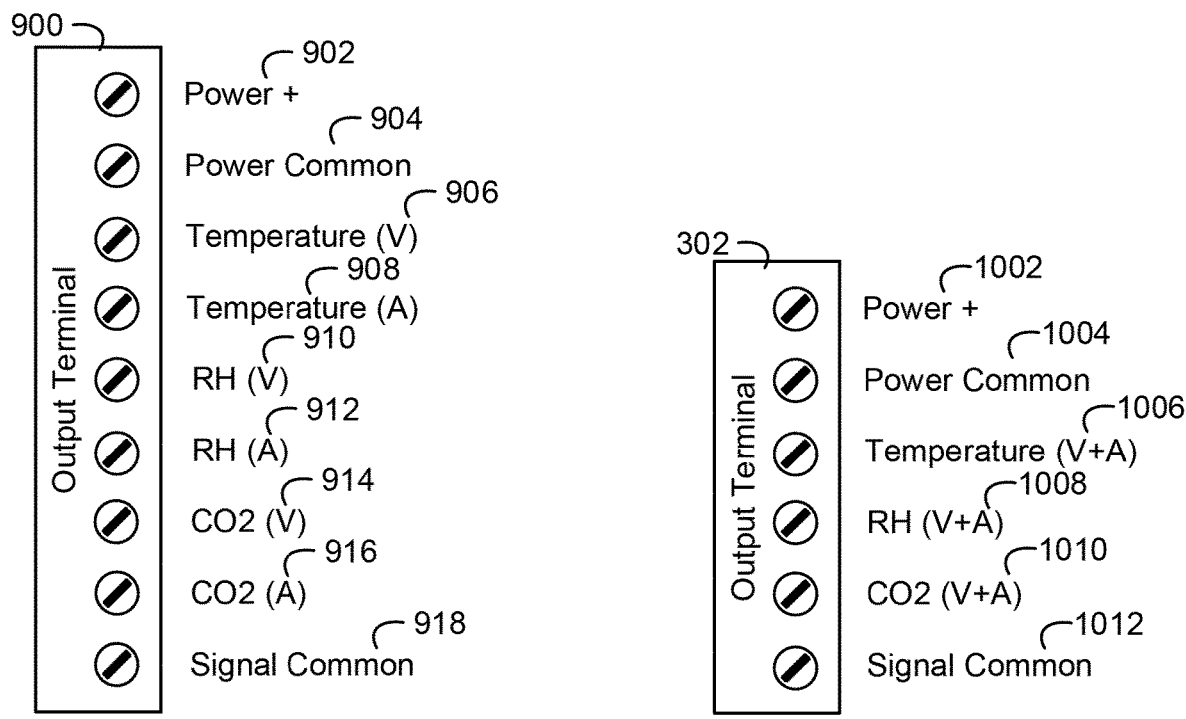
FIG. 9 is a block diagram of an output terminal of a building sensor with an output terminal of a building sensor with redundant analog voltage outputs and analog current outputs, according to an exemplary embodiment.
FIG. 10 is a block diagram of an output terminal of the building sensor described with reference to FIGS. 3-4 with multiple self-configuring analog outputs, according to an exemplary embodiment.

Referring now to FIG. 9, a output terminal 900 with duplicative voltage and current outputs is shown, according to an exemplary embodiment. The output terminal 900 may be a terminal block for a sensor with a hot power connection 802, a common power connection 904, a temperature voltage output 906, a temperature current output 908, an RH voltage output 910, an RH current output 912, a CO2 voltage output 914, a CO2 current output 916, and a signal common connection 918. The connections 902 and 904 may be connections for powering the building sensor from another device, e.g., the building controller 114. The outputs 906-916 may be outputs of environmental conditions (i.e., temperature, RH, and CO2) measured by the building sensor and output as a voltage signal. The signal common connection 812 may be a common connection for the outputs 906-916.

The output terminal 900 includes duplicative outputs, i.e., one output for current and one output for voltage to enable a technician to install a building sensor with the output terminal 900 with a building sensor configured to receive current inputs or another building controller configured to receive voltage outputs. The duplicative connections rely on technician knowledge of the building controller that the building sensor is being connected to. With duplicative connections, excess building sensor space is used. Furthermore, by having an excess number of connections, technician error may be higher. However, instead of requiring duplicative connections, the building sensor 106 may be applicable for current output or voltage output with only one connection for each current and output pair, i.e., the building sensor 106 can self-configure and output either a voltage signal or a current signal.

Referring now to FIG. 10, the output terminal 302 is shown, according to an exemplary embodiment. The output terminal 302 may be a terminal block for a sensor with a hot power connection 1002, a common power connection 1004, a temperature voltage or current output 1006, an RH voltage or current output 1008, a CO2 voltage or current output 1010, and a signal common connection 1012. The power connections 1002 and 1004 can connect to the building controller 114 and receive power for powering the building sensor 106.

The outputs 1006-1010 can be configured to output current or voltage to represent temperature, RH, and/or CO2 (e.g., measured by the sensing device 312 or another sensing device). The connections 1006-1010 can be associated with a self-configuring circuit (e.g., can utilize be outputs for the circuit 300 and/or the control circuit 304). Rather than requiring multiple product versions, e.g., as illustrated in FIG. 8, or requiring duplicative output connections, e.g., as illustrated in FIG. 9, the output terminal 302 of the building sensor 106 includes single connections which the building sensor 106 automatically self-configures to output voltage signals or current signals based on the device connected to connections.

Figure 11:
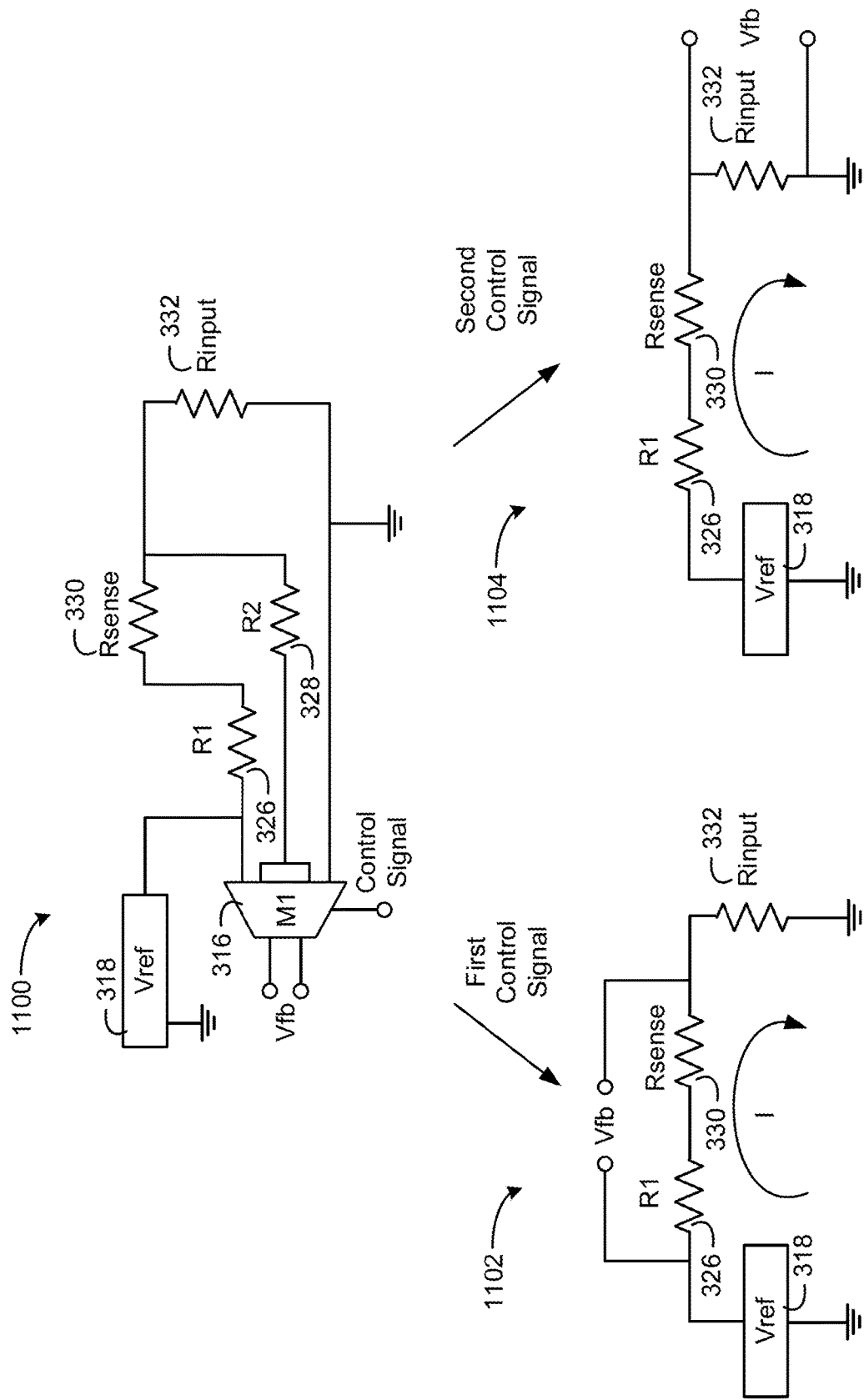
FIG. 11 is a circuit diagram of the self-configuring analog output circuit of FIG. 3 configured to determine an input impedance of an external device connected to the self-configuring analog output, according to an exemplary embodiment.

Referring now to FIG. 11, a circuit 1100 is shown for determining an input impedance of the building controller 114, according to an exemplary embodiment. The circuit 1100 can be the circuit 300 with switch S1 322 open and switch S2 324 closed. Based on the control signal applied to the multiplexer M1 316, the circuit 1100 can be the circuit 1102 or the circuit 1104 respectively. For example, if the multiplexer M1 316 causes the feedback voltage $V_{fb}$ to be connected to the resistors $R_1$ 326 and $R_2$ 328, the circuit 1100 may be, effectively, the circuit 1102. In circuit 1102 the feedback voltage $V_{fb}$ may be the voltage over the resistors $R_1$ 326 and $R_{sense}$ 330, the voltage drop of the resistor $R_2$ 328 may be negligible since a circuit (e.g., the manager circuit 306) configured to sense the voltage $V_{fb}$ may have a high impedance input.

The manager circuit 306 can determine the value of the resistor $R_{input}$ 332. Applying Kirchoff's voltage law to the circuit 1102, $$-V_{ref} + V_{fb} + V_{R_{input}} = 0 \qquad \text{(Equation 1)}$$

Furthermore, the current, I, through the circuit 1102 is, $$I = \frac{V_{ref}}{R_1 + R_{sense} + R_{input}} \qquad \text{(Equation 2)}$$

The voltage across the resistor $R_{input}$ can be defined in terms of the current through the circuit 1102, i.e., $$V_{R_{input}} = IR_{input} \qquad \text{(Equation 3)}$$

Substituting the definition of I into Equation 3 and the definition of $V_{R_{input}}$ into equation 1 results in, $$-V_{ref} + V_{fb} + \frac{V_{ref} R_{input}}{R_1 + R_{sense} + R_{input}} = 0 \quad \text{(Equation 4)}$$

Equation 4, when rearranged to solve for $R_{input}$ is, $$R_{input} = \frac{V_{ref}}{V_{fb}}(R_1 + R_{sense}) - (R_1 + R_{sense}) \quad \text{(Equation 5)}$$

Since the values of $R_1$ 326, $R_{sense}$ 330, $V_{ref}$ 318, and $V_{fb}$ are known or measured values, the only unknown value in Equation 5 is $R_{input}$ 332. In this regard the signal generator circuit 308 can be configured to determine the value of $R_{input}$ 332, the value indicating that the input to the building controller 114 is a current input or a voltage input. The signal generator circuit 308 can be configured to generate the input as a current signal or a voltage signal.

The circuit 1104 may be the reduction of the circuit 1100 when the control signal operates the multiplexer M1 316 to cause the feedback voltage $V_{fb}$ to be the voltage across the resistor $R_2$ 328 and ground. Since the feedback voltage may be supplied a high impedance input, e.g., the manager circuit 306, the voltage drop across the resistor $R_2$ 328 may be negligible and the feedback voltage $V_{fb}$ may be the voltage across the resistor $R_{input}$ 332.

Applying Kirchoff's voltage law to the circuit 1104, $$-V_{ref} + V_{R1+R_{sense}} + V_{fb} = 0 \quad \text{(Equation 6)}$$

The current through the circuit 1104 can be, $$V_{fb} = I R_{input} \quad \text{(Equation 7)}$$

Furthermore, the current through the circuit can be defined as, $$V_{R1+R_{sense}} = I(R_1 + R_{sense}) \quad \text{(Equation 8)}$$

Substituting Equation 7 and Equation 8 into Equation 6 results in, $$-V_{ref} + \frac{V_{fb}}{R_{input}}(R_1 + R_{sense}) + V_{fb} = 0 \quad \text{(Equation 9)}$$

When rearranged and solved for $R_{input}$ 332, Equation 9 becomes, $$R_{input} = \frac{R_1 + R_{sense}}{\frac{V_{ref}}{V_{fb}} - 1} \quad \text{(Equation 10)}$$

Since the values of $R_1$ 326, $R_{sense}$ 330, $V_{ref}$ 318, and $V_{fb}$ are known or measured values, the only unknown value in Equation 10 is $R_{input}$ 332. In this regard the signal generator circuit 308 can be configured to determine the value of $R_{input}$ 332, the value indicating that the input to the building controller 114 is a current input or a voltage input. The signal generator circuit 308 can be configured to generate the input as a current signal or a voltage signal.

Figure 12:
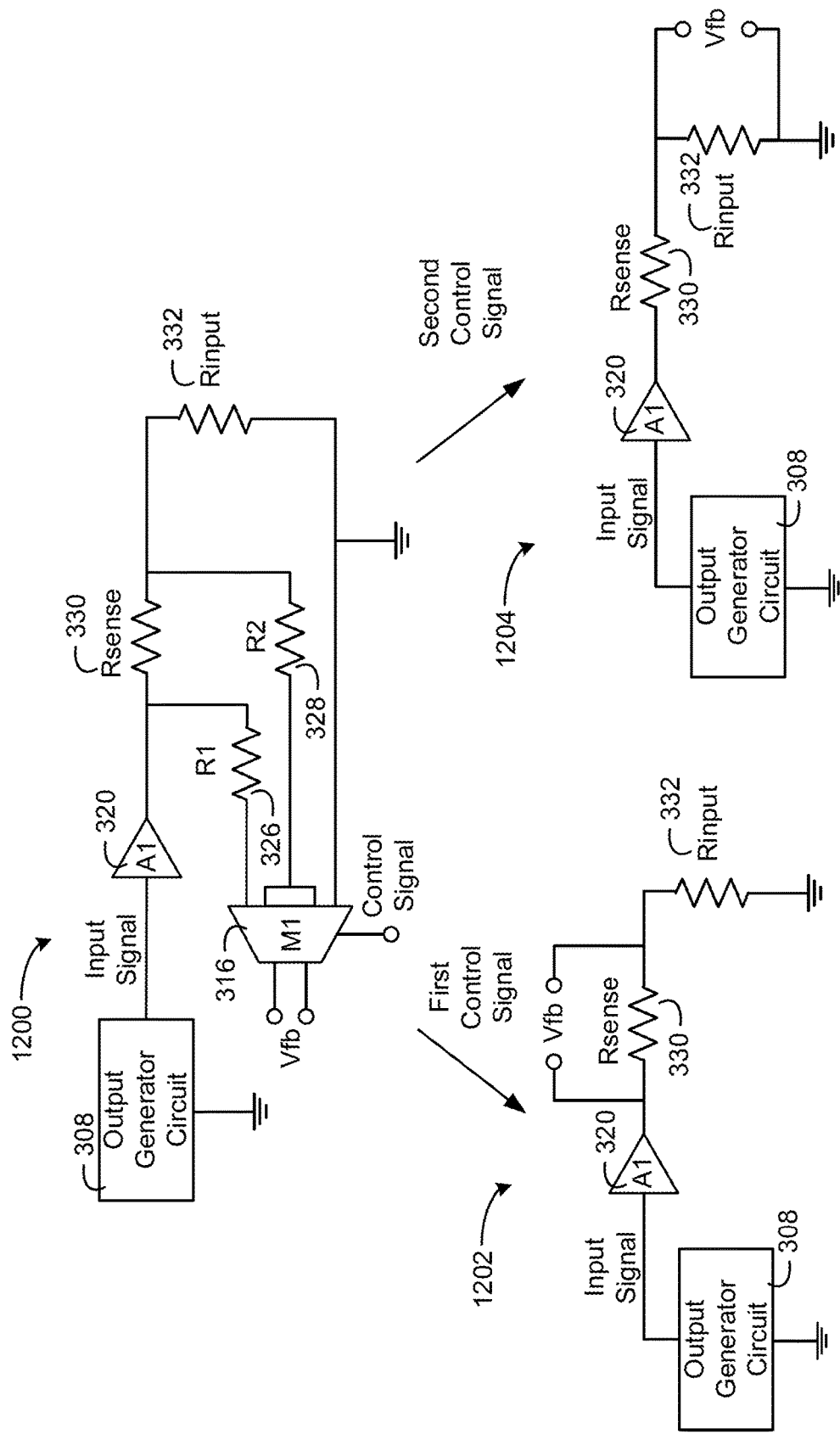
FIG. 12 is a circuit diagram of the self-configuring analog output circuit of FIG. 3 configured to sense a feedback voltage for fault detection, according to an exemplary embodiment.

Referring now to FIG. 12, a circuit 1200 is shown for determining a feedback voltage for fault detection, according to an exemplary embodiment. The circuit 1200 can be the circuit 300 with switch S1 322 closed and switch S2 324 open. Based on the control signal applied to the multiplexer M1 316, the circuit 1200 can be the circuit 1202 or the circuit 1204 respectively. For example, if the multiplexer M1 316 causes the feedback voltage $V_{fb}$ to be the voltage across the resistors $R_1$ 326 and $R_2$ 328, the circuit 1100 may be, effectively, the circuit 1202. In circuit 1202 the feedback voltage $V_{fb}$ may be the voltage over the resistors $R_{sense}$ 330, the voltage drop of the resistor $R_1$ 326 and the resistor $R_2$ 328 may be negligible since a circuit (e.g., the manager circuit 306) configured to sense the voltage $V_{fb}$ may have a high impedance input.

Similarly, the circuit 1204 may be the reduction of the circuit 1200 when the control signal operates the multiplexer M1 316 to cause the feedback voltage $V_{fb}$ to be the voltage across the resistor $R_2$ 328 and ground. Since the feedback voltage may be supplied a high impedance input, e.g., the manager circuit 306, the voltage drop across the resistor $R_2$ 328 may be negligible and the feedback voltage $V_{fb}$ may be the voltage across the resistor $R_{input}$ 332.

When the circuit 1202 is generating a voltage signal, i.e., the signal generator circuit 308 is generating a voltage signal, the input signal, the fault detector circuit 310 can monitor the feedback voltage $V_{fb}$ over the resistor $R_{sense}$ 330. If the feedback voltage $V_{fb}$, when measured over the resistor $R_{sense}$ 330, becomes greater than a predefined amount, this may indicate that there is a short over the resistor $R_{input}$ 332 and the fault detector circuit 310 can generate a fault. If the voltage across the resistor $R_{input}$ 332 becomes zero or close to zero, this may indicate an open circuit.

When the circuit 1204 is generating a voltage signal, i.e., the signal generator circuit 308 is generating a voltage signal, the input signal, the fault detector circuit 310 can monitor the feedback voltage $V_{fb}$ over the resistor $R_{input}$ 332. If the feedback voltage $V_{fb}$, when measured over the resistor $R_{input}$ 332, is less than a predefined amount (approximately zero), this may indicate that there is a short over the resistor $R_{input}$ 332 and the fault detector circuit 310 can generate a fault.

When the circuit 1202 is generating a current signal, i.e., the signal generator circuit 308 is generating a voltage signal causing a particular current to flow through the resistor $R_{input}$ 332, the fault detector circuit 310 can monitor the feedback voltage $V_{fb}$ over the resistor $R_{sense}$ 330 and compare the monitored feedback voltage to the voltage generated by the signal generator circuit 308 to cause current to flow through the resistor $R_{input}$ 332. If the feedback voltage $V_{fb}$, when measured over the resistor $R_{sense}$ 330, is indicative of a current greater than zero flowing through the resistor $R_{sense}$ 330 and the output voltage generated by the signal generator circuit 308 is at a maximum value, the fault detector circuit 310 can generate a fault indicating that there is a lack of output headroom. Furthermore, if the input signal is at a maximum value and the current flowing through the resistor $R_{input}$ 332 is zero, this may indicate that the building sensor 106 is connected to an open circuit and the fault detector circuit 310 can generate a fault.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An environmental building sensor, the environmental building sensor comprising:
   a sensing device configured to measure an environmental condition of a building;
   an output connection between one or more circuits of the environmental building sensor and an external device, the output connection connected to an input impedance of the external device; and
   the one or more circuits configured to:
      detect a feedback voltage, the feedback voltage based on the input impedance;
      determine, based on the feedback voltage, a type of analog input signal that the external device is configured to receive from the environmental building sensor, wherein the type of analog input signal is an analog current input or an analog voltage input; and
      generate an analog input signal based on the determined type of analog input signal and the environmental condition measured by the sensing device and provide the analog input signal to the external device via the output connection.

2. The environmental building sensor of claim 1, wherein the sensing device is configured to sense at least one of a temperature level of the building, a relative humidity (RH) level of the building, or a carbon dioxide ($CO_2$) level of the building.

3. The environmental building sensor of claim 1, wherein the one or more circuits are configured to:
   detect a second feedback voltage; and
   determine whether at least one of the environmental building sensor or the external device is experiencing a fault based on the second feedback voltage.

4. The environmental building sensor of claim 1, wherein the one or more circuits are configured to:
   generate the analog current input and provide the analog current input to the external device;
   detect a second feedback voltage, wherein the second feedback voltage is a voltage across the input impedance; and
   determine whether a fault exists in at least one of the environmental building sensor or the external device by comparing a voltage output generated by the one or more circuits to generate the analog current input to the second feedback voltage and determining that the voltage output is a maximum value.

5. The environmental building sensor of claim 4, wherein the one or more circuits are configured to:
   determine that the fault is an open circuit in response to a first determination that the second feedback voltage is equal to the voltage output and that the voltage output is the maximum value; and
   determine that the fault is a lack of output headroom in response to a second determination that the second feedback voltage is less than the voltage output and that the voltage output is the maximum value.

6. The environmental building sensor of claim 1, wherein the one or more circuits are configured to:
   generate the analog voltage input and provide the analog voltage input to the external device;
   detect a second feedback voltage; and
   determine whether a fault exists in at least one of the environmental building sensor or the external device based on the second feedback voltage.

7. The environmental building sensor of claim 6, wherein the fault is a short, wherein the one or more circuits are configured to determine whether the fault exists by determining whether the second feedback voltage is greater than or less than a predefined level.

8. The environmental building sensor of claim 6, wherein the second feedback voltage is at least one of a third feedback voltage detected over a resistor of the one or more circuits in series with the input impedance of the external device or a fourth feedback voltage detected over the input impedance of the external device.

9. A building system of a building, the building system comprising:
   a building controller comprising an input connection, wherein the input connection is associated with an input impedance, wherein the building controller is configured to receive an analog current input or an analog voltage input via the input connection and perform one or more control actions based on the analog current input or the analog voltage input; and
   a building sensor comprising one or more circuits configured to:

detect a feedback voltage, the feedback voltage based on the input impedance;

determine, based on the feedback voltage, a type of analog input signal that the building controller is configured to receive from the building sensor, wherein the type of analog input signal is the analog current input or the analog voltage input; and generate an analog input signal based on the determined type of analog input signal and a condition measured by a sensing device and provide the analog input signal to the building controller.

10. The building system of claim 9, wherein the one or more circuits are configured to:

detect a second feedback voltage; and determine whether at least one of the building sensor or the building controller is experiencing a fault based on the second feedback voltage.

11. The building system of claim 9, wherein the one or more circuits are configured to:

generate the analog voltage input and provide the analog voltage input to the building controller;

detect a second feedback voltage; and determine whether a fault exists in at least one of the building sensor or the building controller based on the second feedback voltage.

12. A self-configuring analog output circuit of a sensor, the self-configuring analog output circuit comprising one or more circuits configured to:

detect a feedback voltage, the feedback voltage based on an input impedance of an external device connected to the self-configuring analog output circuit;

determine, based on the feedback voltage, a type of analog input signal that the external device is configured to receive from the self-configuring analog output circuit, wherein the type of analog input signal is an analog current input or an analog voltage input; and generate an analog input signal based on the determined type of analog input signal and a condition measured by a sensing device of the sensor and provide the analog input signal to the external device.

13. The circuit of claim 12, wherein the one or more circuits are configured to:

detect a second feedback voltage; and determine whether the circuit is experiencing a fault based on the second feedback voltage.

\* \* \* \* \*